(12) United States Patent
Miller et al.

(10) Patent No.: US 11,025,006 B2
(45) Date of Patent: Jun. 1, 2021

(54) COMMUNICATION SYSTEM HAVING CONNECTOR ASSEMBLY

(71) Applicant: TE CONNECTIVITY CORPORATION, Berwyn, PA (US)

(72) Inventors: Keith Edwin Miller, Manheim, PA (US); Francis John Blasick, Halifax, PA (US); Michael John Walmsley, Elizabethtown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/560,496

(22) Filed: Sep. 4, 2019

(65) Prior Publication Data

US 2021/0066853 A1 Mar. 4, 2021

(51) Int. Cl.

| H01R 13/631 | (2006.01) |
|---|---|
| H01R 13/516 | (2006.01) |
| H01R 12/91 | (2011.01) |
| H01R 24/28 | (2011.01) |
| H01R 13/08 | (2006.01) |

(Continued)

(52) U.S. Cl.
CPC ......... *H01R 13/6315* (2013.01); *H01R 12/91* (2013.01); *H01R 13/08* (2013.01); *H01R 13/516* (2013.01); *H01R 24/28* (2013.01); *H01R 24/66* (2013.01); *H01R 2107/00* (2013.01)

(58) Field of Classification Search
CPC .... H01R 13/6315; H01R 12/91; H01R 13/08; H01R 13/516; H01R 24/28; H01R 24/66; H01R 2107/00
See application file for complete search history.

(56) References Cited

U.S. PATENT DOCUMENTS

| 1,536,082 A | 5/1925 | Douglas |
|---|---|---|
| 1,703,046 A | 2/1929 | Paiste |
| 1,875,378 A | 9/1932 | Hastings |

(Continued)

FOREIGN PATENT DOCUMENTS

| DE | 19844281 A1 | 5/2000 |
|---|---|---|
| EP | 0901189 A2 | 3/1999 |

(Continued)

OTHER PUBLICATIONS

International Search Report for corresponding Application No. PCT/US2016/065829 dated Mar. 3, 2017 (3 pages).

(Continued)

*Primary Examiner* — Renee S Luebke
*Assistant Examiner* — Paul D Baillargeon

(57) ABSTRACT

A connector assembly includes a connector module having a connector body with side edges and end edges. The connector body has contact channels holding contacts. The connector assembly includes a mounting frame having side walls and an end wall opposite a window between the side walls. The window is open to and provides access to a passage that receives the connector module. The mounting frame includes a connector module support structure for supporting the connector module in the passage that defines a confined space oversized relative to the connector body of the connector module to allow a limited amount of floating movement in the confined space in a lateral direction that is perpendicular to the mating direction.

20 Claims, 8 Drawing Sheets

(51) Int. Cl.
*H01R 24/66* (2011.01)
*H01R 107/00* (2006.01)

(56) References Cited

U.S. PATENT DOCUMENTS

| | | |
|---|---|---|
| 2,000,318 A | 5/1935 | Cannon |
| 2,374,971 A | 5/1945 | Benander |
| 2,404,682 A | 7/1946 | Baker |
| 2,410,618 A | 11/1946 | Zelov |
| 2,677,811 A | 5/1954 | Anderson et al. |
| 2,801,395 A | 7/1957 | Quackenbush |
| 3,094,364 A | 6/1963 | Lingg |
| 3,128,138 A | 4/1964 | Noschese |
| 3,177,464 A | 4/1965 | Solorow et al. |
| 3,266,006 A | 8/1966 | Abbott |
| 3,277,421 A | 10/1966 | Gobrecht |
| 3,562,696 A | 2/1971 | Barnhart et al. |
| 3,566,334 A | 2/1971 | Ziegler, Jr. |
| 3,668,608 A | 6/1972 | Ziegler, Jr. |
| 3,671,921 A | 6/1972 | Baker, III et al. |
| 4,106,834 A | 8/1978 | Hororwitz |
| 4,232,930 A | 11/1980 | Teti |
| 4,392,699 A | 7/1983 | Weingartner |
| 4,407,553 A | 10/1983 | Dvoorachek et al. |
| 4,413,875 A | 11/1983 | Mattingly |
| 4,659,162 A | 4/1987 | Cartesse |
| 4,659,164 A | 4/1987 | Reuss |
| 4,697,859 A | 10/1987 | Fisher, Jr. |
| 4,764,130 A | 8/1988 | DiClemente |
| 4,909,748 A * | 3/1990 | Kozono ............ H01R 13/6315 439/247 |
| 4,927,388 A | 5/1990 | Gutter |
| 4,938,718 A | 7/1990 | Guendel |
| 4,940,417 A | 7/1990 | Hyogo et al. |
| 4,944,568 A | 7/1990 | Danbach et al. |
| 5,000,693 A | 3/1991 | Hatagishi et al. |
| 5,217,386 A | 6/1993 | Ohsumi et al. |
| 5,383,790 A | 1/1995 | Kerek et al. |
| 5,590,229 A | 12/1996 | Goldman et al. |
| 5,651,683 A | 7/1997 | Shimamura et al. |
| 5,671,311 A | 9/1997 | Stillie et al. |
| 5,689,598 A | 11/1997 | Dean, Jr. et al. |
| 5,752,845 A | 5/1998 | Fu |
| 5,791,939 A | 8/1998 | Tanigawa |
| 5,944,548 A | 8/1999 | Saito |
| 6,007,375 A * | 12/1999 | Mackowiak ............ H01R 9/16 439/567 |
| 6,485,194 B1 | 11/2002 | Shirakawa |
| 6,517,380 B1 | 2/2003 | Deutsch |
| 6,827,597 B1 | 12/2004 | Metzbower et al. |
| 7,033,211 B2 | 4/2006 | Bartholoma et al. |
| 7,070,458 B2 | 7/2006 | Axenbock et al. |
| 7,234,967 B2 | 6/2007 | Weidner et al. |
| 7,252,525 B2 | 8/2007 | Ide et al. |
| 7,416,415 B2 | 8/2008 | Hart et al. |
| 7,485,012 B2 | 2/2009 | Daugherty et al. |
| 7,517,234 B2 | 4/2009 | Akino |
| 7,581,984 B2 | 9/2009 | Moyon et al. |
| 7,704,077 B1 | 4/2010 | Morley |
| 7,798,834 B2 | 9/2010 | Wu |
| 7,887,335 B2 | 2/2011 | Morley |
| 7,896,655 B1 | 3/2011 | Blasick et al. |
| 8,002,574 B1 | 8/2011 | Yi |
| 8,029,324 B1 | 10/2011 | Yi et al. |
| 8,182,297 B2 | 5/2012 | Lin |
| 8,282,415 B1 | 10/2012 | Foltz et al. |
| 8,360,806 B2 | 1/2013 | Yi et al. |
| 8,360,807 B2 | 1/2013 | Buff et al. |
| 8,672,708 B2 | 3/2014 | Ritter et al. |
| 8,758,055 B2 | 6/2014 | McAlonis et al. |
| 8,801,460 B2 | 8/2014 | Van Swearingen et al. |
| 8,851,934 B2 | 10/2014 | McAlonis et al. |
| 8,894,431 B2 | 11/2014 | Tiberghien et al. |
| 9,130,328 B1 | 9/2015 | Huang et al. |
| 9,160,096 B2 | 10/2015 | Morley |
| 9,362,638 B2 | 6/2016 | Ljubijankic et al. |
| 9,368,883 B2 | 6/2016 | Chiang et al. |
| 9,444,169 B2 | 9/2016 | Gates |
| 9,608,388 B2 | 3/2017 | Kondo et al. |
| 9,627,782 B2 | 4/2017 | Fackler |
| 9,735,519 B2 | 8/2017 | Yi et al. |
| 10,166,093 B2 | 1/2019 | Felix et al. |
| 2004/0253869 A1 | 12/2004 | Yamaguchi et al. |
| 2005/0239310 A1 | 10/2005 | Baker |
| 2008/0026622 A1 | 1/2008 | Tomizu et al. |
| 2009/0028495 A1 | 1/2009 | Anrig et al. |
| 2013/0236142 A1 | 9/2013 | Fabian et al. |
| 2014/0206221 A1 | 7/2014 | Morley |
| 2014/0308008 A1 | 10/2014 | Mougin et al. |
| 2015/0234127 A1 | 8/2015 | Paul Chen et al. |
| 2015/0380840 A1 | 12/2015 | Chiang et al. |
| 2016/0116695 A1 | 4/2016 | Nekado et al. |
| 2017/0170611 A1 | 6/2017 | Yi et al. |
| 2018/0332726 A1 | 11/2018 | Zhu et al. |
| 2018/0366844 A1 | 12/2018 | Beganovic et al. |
| 2019/0227245 A1 | 7/2019 | Miller et al. |
| 2019/0229475 A1 * | 7/2019 | Miller .................. H01R 13/516 |
| 2019/0229476 A1 | 7/2019 | Miller et al. |

FOREIGN PATENT DOCUMENTS

| | | |
|---|---|---|
| EP | 2354824 A1 | 1/2010 |
| EP | 3514889 A1 | 7/2019 |
| JP | H07272810 A | 10/1995 |
| WO | 2015038413 A1 | 3/2015 |
| WO | 2017100573 A1 | 6/2017 |

OTHER PUBLICATIONS

Morley "Multi-Contact Coax Connectors and Vita Standards" TE Aerospace, Defense & Marine (6 pages).
Extended European Search Report for corresponding EP Application No. 19152568.2-1201 dated Jun. 6, 2019 (4 pages).
European Search Report, dated Feb. 1, 2021, EP 20 19 3837, European Application No. 20193837.0-1201.

* cited by examiner

COMMUNICATION SYSTEM HAVING CONNECTOR ASSEMBLY

BACKGROUND

The subject matter described and/or illustrated herein relates generally to communication systems having connector assemblies.

Connectors are known for interconnecting various components, such as cables, circuit boards, and/or the like. Some known connectors are coaxial connectors including one or more coaxial contacts including a signal element and a ground element that is arranged coaxially with the signal element. Each coaxial contact may have a cable terminated thereto. The coaxial connectors may be used for a wide variety of applications, such as, but not limited to, radio frequency (RF) interconnections. As one example, a backplane communication system may include a large backplane circuit board that includes one or more windows. Each window is configured to receive a coaxial connector that is also mounted to the backplane circuit board using, for example, hardware. As such, the coaxial connectors are presented along one side of the circuit board for mating with corresponding coaxial connectors of a daughter card assembly or assemblies. Other known connectors, such as pin and socket connectors, have signal contacts and ground contacts arranged in a contact array. Such connectors may be terminated to a substrate, such as a circuit board, for mating with a mating connector. Other known connectors, such as fiber optic connectors, include fiber optic contacts. Such fiber optic connectors may be mounted to a substrate, such as a circuit board.

Known connectors are not without disadvantages. For example, it may be desirable to have connectors that have a greater density of contacts. Even with greater densities, however, it may be difficult to mate the opposing connectors. For example, the contacts of the connectors may be exposed and at risk of being damaged if the connectors are not sufficiently aligned during the mating operation.

Accordingly, there is a need for a connector having a greater density of contacts that also enables alignment of the contacts during the mating operation.

BRIEF DESCRIPTION

In one embodiment, a connector assembly is provided including a connector module having a connector body extending between a front side and a rear side. The connector body has edges between the front side and the rear side. The edges include a first side edge, a second side edge opposite the first side edge, a first end edge and a second end edge opposite the first end edge. The connector body has contact channels therethrough between the front side and the rear side. The contact channels hold contacts in corresponding contact channels. The contacts are presented along the front side for engaging corresponding mating contacts of a mating connector. The front side faces in a mating direction along a mating axis. The connector assembly includes a mounting frame having a passage extending between a mating side and a mounting side of the mounting frame that face in opposite directions. The mounting frame has a first side wall, a second side wall opposite the first side wall, and an end wall between the first side wall and the second side wall. The mounting frame has a window between the first side wall and the second side wall opposite the end wall. The window is open to and provides access to the passage. The passage receives the connector body of the connector module through the window in a direction generally perpendicular to the mating axis. The mounting side faces in a mounting direction and is configured to interface with a support wall. The mounting frame includes a connector module support structure for supporting the connector module in the passage of the mounting frame. The connector module support structure defines a confined space oversized relative to the connector body of the connector module to allow a limited amount of floating movement in the confined space in a lateral direction that is perpendicular to the mating direction.

In another embodiment, a connector assembly is provided. The connector assembly is configured to be mounted to a support wall at an opening in the support wall defined by support wall edges extending between a first surface and a second surface of the support wall. The connector assembly includes a connector module having a connector body extending between a front side and a rear side. The connector body has edges between the front side and the rear side. The edges include a first side edge, a second side edge opposite the first side edge, a first end edge and a second end edge opposite the first end edge. The edges of the connector body are configured to pass through the opening in the support wall such that the front side is forward of the first surface of the support wall and the rear side is rearward of the first surface of the support wall. The connector body has contact channels therethrough between the front side and the rear side. the contact channels hold contacts in corresponding contact channels. The contacts are presented along the front side for engaging corresponding mating contacts of a mating connector. The front side faces in a mating direction along a mating axis. The contacts are spring biased within the contact channels for mating with the mating contacts. The contacts have cables terminated thereto extending rearward from the connector module. The connector assembly includes a mounting frame having a passage extending between a mating side and a mounting side of the mounting frame that face in opposite directions. The mounting frame has a first side wall, a second side wall opposite the first side wall, and an end wall between the first side wall and the second side wall. The mounting frame has a window between the first side wall and the second side wall opposite the end wall. The window is open to and provides access to the passage. The passage receives the connector body of the connector module through the window in a direction generally perpendicular to the mating axis. The mounting side faces in a mounting direction and is configured to interface with the first surface of the support wall. The mounting frame includes a connector module support structure for supporting the connector module in the passage of the mounting frame. The connector module support structure defines a confined space oversized relative to the connector body of the connector module to allow a limited amount of floating movement in the confined space. The connector module support structure includes a first side blocking surface defined by the first side wall, a second side blocking surface defined by the second side wall, and a first end blocking surface defined by the first end wall. The first side blocking surface cooperates with the second side blocking surface to confine movement of the connector module in a first lateral direction to a limited amount of floating movement in the first lateral direction within the passage. The first end blocking surface cooperates with the support wall edge of the support wall to confine movement of the connector module in a second lateral direction to a limited amount of floating movement in the second lateral direction within the passage.

In another embodiment, a connector assembly is configured to be mounted to a support wall. The connector assembly includes a connector module having a connector body extending between a front side and a rear side. The connector body has edges between the front side and the rear side. The edges include a first side edge, a second side edge opposite the first side edge, a first end edge and a second end edge opposite the first end edge. The connector body has contact channels therethrough between the front side and the rear side. The contact channels hold contacts in corresponding contact channels. The contacts are presented along the front side for engaging corresponding mating contacts of a mating connector. The front side faces in a mating direction along a mating axis. The contacts are spring biased within the contact channels for mating with the mating contacts. The contacts have cables terminated thereto extending rearward from the connector module. The connector assembly includes a mounting frame having a passage extending between a mating side and a mounting side of the mounting frame that face in opposite directions. The mounting frame has a first side wall, a second side wall opposite the first side wall, and an end wall between the first side wall and the second side wall. The mounting frame has a window between the first side wall and the second side wall opposite the end wall. The window is open to and provides access to the passage. The passage receives the connector body of the connector module through the window in a direction generally perpendicular to the mating axis. The mounting side faces in a mounting direction and is configured to interface with the support wall. The mounting frame includes a connector module support structure for supporting the connector module in the passage of the mounting frame. The connector module support structure defines a confined space oversized relative to the connector body of the connector module to allow a limited amount of floating movement in the confined space. The connector module support structure includes a first side blocking surface defined by the first side wall, a second side blocking surface defined by the second side wall, and a first end blocking surface defined by the first end wall. The connector module support structure includes a support pin coupled to the mounting frame and coupled to the connector body of the connector module. The first side blocking surface cooperates with the second side blocking surface to confine movement of the connector module in a first lateral direction to a limited amount of floating movement in the first lateral direction within the passage. The first end blocking surface cooperates with the support pin to confine movement of the connector module in a second lateral direction to a limited amount of floating movement in the second lateral direction within the passage.

DETAILED DESCRIPTION

Embodiments set forth herein include connector assemblies and communication systems that include such connector assemblies. The communication system may include, for example, a circuit board that is secured to the connector assembly. In some embodiments, the communication system is a backplane (or midplane) communication system. As used herein, the terms backplane and midplane are used interchangeably and represent a system interface for multiple daughter card assemblies (e.g., line cards or switch cards). In other embodiments, the communication system is a circuit board assembly (e.g., daughter card assembly). In other embodiments, the communication system is a fiber optic communication system. One or more embodiments permit a connector module of the connector assembly to float during a mating operation. One or more embodiments enable using a denser grouping of contacts.

As used herein, phrases such as "a plurality of [elements]," "a set of [elements]," "an array of [elements]," and the like, when used in the detailed description and claims, do not necessarily include each and every element that a component may have. For instance, the phrase "the connector module having a plurality of contacts that include [a recited feature]" does not necessarily mean that each and every contact of the connector module has the recited feature. Instead, only some of the contacts may have the recited feature and other contacts of the connector module may not include the recited feature. As another example, the detailed description or the claims may recite that a connector assembly includes "cable assemblies, each of which including a [recited feature]." This phrase does not exclude the possibility that other cable assemblies of the connector assembly may not have the recited feature. Accordingly, unless explicitly stated otherwise (e.g., "each and every cable assembly of the connector module"), embodiments may include similar elements that do not have the same features.

Figure 1:
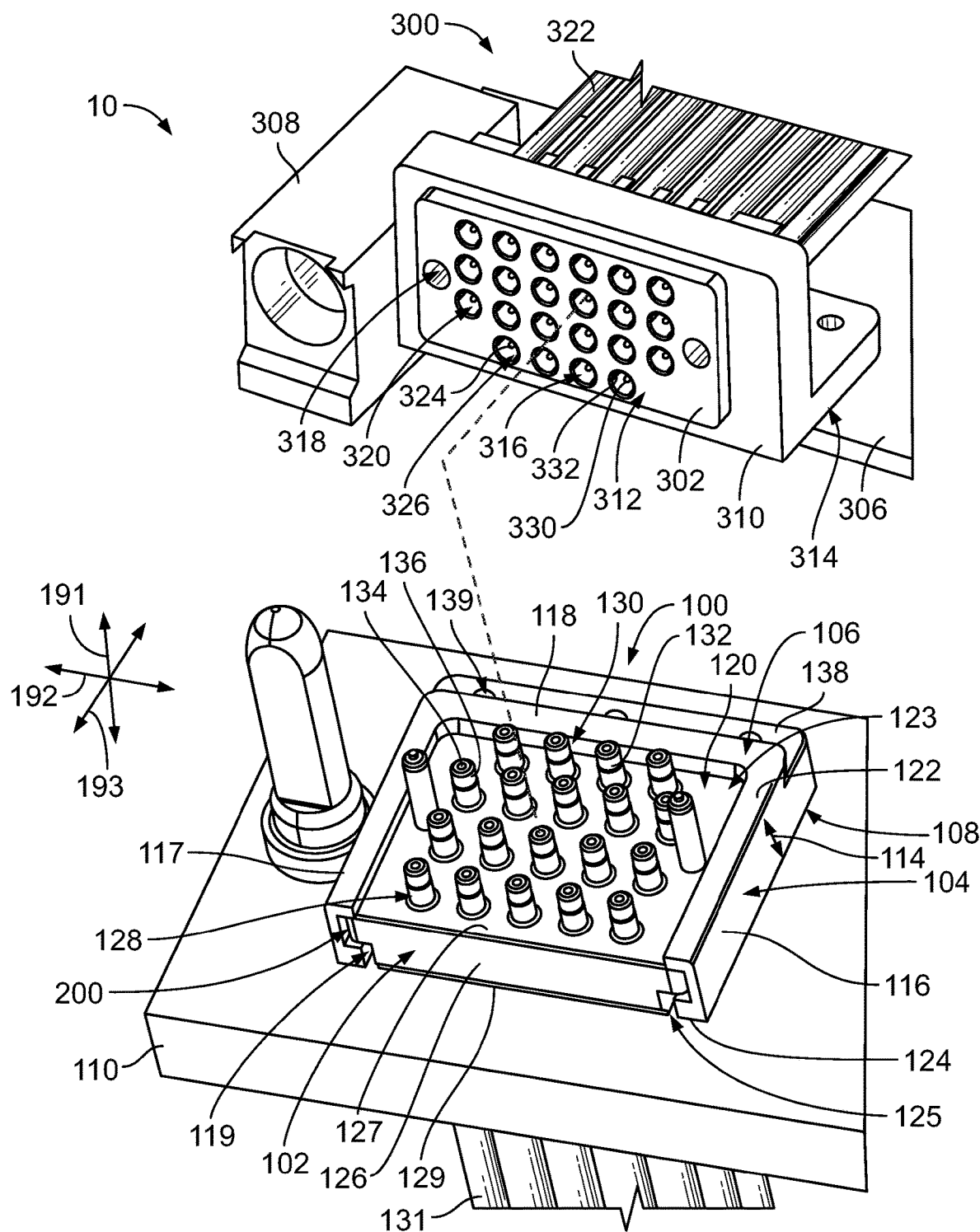
FIG. 1 is a perspective view of a communication system formed in accordance with an exemplary embodiment having a connector assembly.

FIG. 1 is a perspective view of a communication system 10 formed in accordance with an exemplary embodiment, showing a connector assembly 100 and a mating connector assembly 300 in an unmated state. In the illustrated embodiment, the connector assemblies 100, 300 are coaxial connector assemblies and may be referred to hereinafter as coaxial connector assemblies 100, 300. However, the communication system 10 may be provided with other types of connector assemblies, such as pin and socket connector assemblies, fiber optic connector assemblies, and the like. The connector assemblies 100, 300 are configured to be mated along a mating axis.

In some applications, the connector assemblies 100, 300 may be referred to more generally as a circuit board assemblies. The communication system 10 may be configured for radiofrequency (RF) applications. In particular embodiments, the communication system 10 and/or its components, such as the connector assembly 100 and/or 300, are configured to satisfy military and aerospace applications. For example, the components of the communication system 10 may be configured to satisfy one or more industry or government standards, such as MIL-STD-348. To illustrate one example of the communication system 10, the connector assemblies 100, 300 may form an interconnect between analog and digital sections of a radio. The connector assembly 300 may perform analog functions. The connector assembly 300 may be replaced with other connector assemblies that are configured to perform the same or different operations. The digital functions, including digital signal processing, may be performed by a communication component (not shown) that is coupled to the connector assembly 100. The other communication component may be another daughter card assembly (not shown).

The communication system 10 and/or its components (e.g., the connector assembly 100 and/or 300) may be configured to satisfy one or more industry or government standards. By way of example only, embodiments may be configured to satisfy the VME International Trade Association (VITA) standards (e.g., VITA 48, VITA 67, et al.). The communication system 10 and/or its components may have an operating speed that achieves 50 GHz or greater. In particular embodiments, the communication system 10 and/or its components may achieve an operating speed of 60 GHz or greater. It should be understood, however, that other embodiments may be configured for different standards and may be configured to operate at different speeds. In some configurations, embodiments may be configured to operate within the range of DC to 60.0 GHz.

In an exemplary embodiment, the connector assembly 300 is a daughter card assembly having a connector module 302 and a substrate 306. The connector module 302 is mounted to the substrate 306. The substrate 306 may be a circuit card, such as a daughter card. The connector assembly 300 includes a guide module 308 mounted to the substrate 306 proximate to the connector module 302. The guide module 308 is used to guide mating with the connector assembly 100. In the illustrated embodiment, the guide module 308 includes an opening configured to receive an alignment pin. The opening may be chamfered or have a lead-in. Other types of guide features may be used in alternative embodiments, such as a guide post. In the illustrated embodiment, the connector module 302 is a right-angle connector module having the substrate 306 oriented perpendicular to the mating face of the connector module 302. The substrate 306 is oriented perpendicular to the substrate of the connector assembly 100. However, other orientations are possible in alternative embodiments. For example, the connector module 302 may be a mezzanine connector having the substrate 306 oriented parallel to the mating face and parallel to the substrate of the connector assembly 100.

The connector module 302 includes a connector body 310 holding cable assemblies 320. The connector body 310 extends between a mating end 312 and a mounting end 314. Optionally, the mounting end 314 may be oriented perpendicular to the mating end 312. The mounting end 314 is mounted to the substrate 306. In the illustrated embodiment, the mating end 312 is oriented perpendicular to the substrate 306. The connector body 310 includes a plurality of contact channels 316 receiving corresponding cable assemblies 320. The connector body 310 includes alignment features 318 for aligning the connector module 302 with the connector assembly 100 during mating. In the illustrated embodiment, the alignment features 318 are openings and may be referred to hereinafter as openings 318. Other types of alignment features may be provided in alternative embodiments. The openings 318 may be arranged to provide keyed mating with the connector assembly 100.

Each cable assembly 320 includes a cable 322 and a contact 324 terminated to the end of the cable 322. The contact 324 has a mating end 326 for mating with the coaxial connector assembly 100. In various embodiments, the contact 324 is a coaxial contact; however, other types of contacts may be provided in alternative embodiments, such as pin contacts, socket contacts, fiber optic contacts (for example, fiber optic ferrules), and the like. In an exemplary embodiment, the coaxial contact 324 is an RF contact. The coaxial contact 324 includes an inner contact 330 and an outer contact 332 surrounding the inner contact 330. The inner contact 330 is configured to be terminated to a conductor of the cable 322. The outer contact 332 is configured to be terminated to a shield, such as a cable braid, of the cable 322. Other arrangements are possible in alternative embodiments. In alternative embodiments, the connector assembly 300 does not include the cables 322 that directly couple to the contacts 324. For example, the contacts 324 may directly terminate to the substrate 306 (for example, the daughtercard) and/or may be communicatively coupled to cables through traces and vias (not shown) of the substrate 306.

For reference, the connector assembly 100 is oriented with respect to mutually perpendicular axes 191-193, which includes a mating axis 191, a first lateral axis 192, and a second lateral axis 193 (the connector assembly 300 is illustrated in FIG. 1 rotated 90° relative to the mating direction along the mating axis 191). The first and second lateral axes 192, 193 may define a lateral plane. As used herein, if an element moves "laterally" or in a "lateral direction," the movement may be in any direction along the lateral plane. For example, the movement may be parallel to the first lateral axis 192, parallel to the second lateral axis 193, or in a direction with a component along the first lateral axis 192 and a component along the second lateral axis 193. The connector assembly 100 may have any orientation with respect to gravity.

The connector assembly 100 includes a connector module 102 and a mounting frame 104 that are operably coupled to each other. The connector module 102 is mounted to a support wall 110. The support wall 110 may be, for example, a circuit board (for example, a backplane circuit board), a panel, or another type of wall. The mounting frame 104 is used to secure the connector module 102 to the support wall 110. In an exemplary embodiment, the mounting frame 104 is slightly oversized relative to the connector module 102 such that the connector module 102 has a limited amount of floating movement relative to the mounting frame 104, such as for alignment with the connector assembly 300 during mating. During operation or usage of the connector assembly 100, a portion of the connector module 102 is floatably held in the mounting frame 104, to allow relative movement between the support wall 110 and the connector module 102. For example, the connector module 102 is permitted to move laterally (e.g., in a lateral direction) during a mating operation (for example, parallel to the plane of the support wall 110). The lateral direction may be parallel to the first lateral axis 192 or parallel to the second lateral axis 193. However, it should be understood, that the lateral direction may be any direction that is perpendicular to the mating axis 191 or parallel to a plane defined by the first and second lateral axes 192, 193.

The mounting frame 104 includes opposite mating and mounting sides 106, 108. More specifically, the mating side 106 is configured to face in a mating direction (for example, forward) along the mating axis 191, and the mounting side 108 is configured to face in a mounting direction (for example, rearward) along the mating axis 191 that is opposite the mating direction. The mounting frame 104 has a thickness 114 that is defined between the mating and mounting sides 106, 108. The mounting frame 104 has an outer frame edge defined by a first side wall 116, a second side wall 117 opposite the first side wall 116, a first end wall 118, and a window 119 opposite the first end wall 118. The window 119 extends between the first and second side walls 116, 117. The first and second side walls 116, 117 extend between the first end wall 118 and the window 119. In the illustrated embodiment, the mounting frame 104 has a substantially rectangular profile, but the mounting frame 104 may have profiles with other shapes in alternative embodiments. In an exemplary embodiment, the mounting frame 104 is U-shaped defined by the side walls 116, 117 and the end wall 118.

In an exemplary embodiment, the mounting frame 104 includes a passage 120 that extends through the mating and mounting sides 106, 108. The window 119 is open to and provides access to the passage 120. The window 119 is sized and shaped to receive the connector module 102. For example, the connector module 102 may be side loaded into the passage 120 through the window 119 and/or the mounting frame 104 may be side-loaded onto the connector module 102. The passage 120 is sized and shaped to receive a portion of the connector module 102. For example, the mounting frame 104 includes a front edge 122 (FIG. 1) along the mating side 106, and a back edge 124 (FIG. 3) along the mounting side 108. The front edge 122 defines a front opening 123 (FIG. 1) to the passage 120, and the back edge 124 defines a back opening 125 (FIG. 3) to the passage 120. The passage 120 extends between the front and back openings 123, 125. The window 119 is open to the front opening 123 and the back opening 125.

In an exemplary embodiment, the mounting frame 104 includes a connector module support structure 200 used to support the connector module 102 relative to the mounting frame 104. For example, the connector module support structure 200 includes blocking surfaces (described below) that engage the connector module 102 and retain the connector module 102 in the mounting frame 104. The connector module support structure 200 prevents the connector module 102 from passing freely through the passage 120. The connector module support structure 200 may also prevent the connector module 102 from moving laterally beyond a confined space. For example, the connector module support structure 200 forms boundaries that define a limited amount of floating movement of the connector module 102 relative to the mounting frame 104. In an exemplary embodiment, the connector module support structure 200 includes support elements, such as support pins (described below) to support the connector module 102 relative to the mounting frame 104. The support pins may cooperate with the blocking surfaces to confine the connector module 102 in the passage 120 relative to the support wall 110. In other various embodiments, the support wall 110 may form part of the connector module support structure 200. For example, the connector module 102 may engage the support wall 110 to locate the connector module 102 within the passage 120.

The connector module 102 includes a connector body 126 having a front side 127 and a rear side 129 (FIG. 3) that face in the mating direction and the mounting direction, respectively. The connector module 102 also includes a contact array 130 of contacts 132 that are coupled to the connector body 126. In particular embodiments, a pitch (or center-to-center spacing) between adjacent contacts 132 may be between 1.50 mm and 5.00 mm. In particular embodiments, the pitch may be between 2.00 mm and 3.50 mm or, more particularly, between 2.50 mm and 2.9 mm. In other embodiments, however, the pitch may be greater or smaller. In various embodiments, the contacts 132 are coaxial contacts; however, the contacts 132 may be other types of contacts, such as pin contacts, socket contacts, fiber optic contacts, and the like.

The connector body 126 holds the contacts 132 at designated positions for engaging corresponding contacts 324. In the illustrated embodiment, the contacts 132 are elements of corresponding cable assemblies 128. The contacts 132 represent mating ends of the corresponding cable assemblies 128. In the illustrated embodiment, each of the contacts 132 includes a signal element 134 and a ground element 136 that is coaxially aligned with the signal element 134; however, other types of contacts may be used in alternative embodiments. The signal and ground elements 134, 136 may be electrically coupled to signal and ground paths (not shown) through cables 131 of the cable assemblies 128. The signal element 134 may be a center contact 134 and the ground element 136 may be an outer contact 136. In alternative embodiments, the connector assembly 100 does not include the cables 131 that directly couple to the contacts 132. For example, the contacts 132 may directly terminate to a substrate (not shown).

The mounting frame 104 may include a frame extension 138. The frame extension 138 represents a section of the mounting frame 104 that extends laterally away from the passage 120. For example, the frame extension 138 may extend from the first end wall 118 away from the passage 120. The frame extension 138 is configured to interface with the support wall 110. For example, the mounting frame 104 may include posts extending from the mounting side 108 that are received in corresponding openings in the support wall 110 to orient the mounting frame 104 relative to the support wall 110. The frame extension 138 includes one or more through holes 139 that are sized and shaped to receive hardware (e.g., screws, bolts, plugs, and the like) for securing the mounting frame 104 to the support wall 110. In some embodiments, the through holes 139 may be defined by threaded surfaces of the mounting frame 104 for engaging screws. In other embodiments, the surfaces that define the through holes 139 are not threaded. The mounting frame 104 is configured to have a fixed position relative to the support wall 110. The connector module 102, on the other hand, is permitted to float relative to the support wall 110 within the confined space.

In an exemplary embodiment, the connector assembly 100 has a footprint relative to the support wall 110. The footprint is the outer perimeter of the connector assembly 100 on the surface of the support wall 110. The footprint may be defined by the mounting frame 104. In various embodiments, a portion of the footprint is defined by the connector module 102. For example, because the second end of the mounting frame 104 is open and includes the window 119, the second end of the footprint may be defined by the connector module 102, which may be flush with the second end of the mounting frame 104 or which may extend beyond the second end of the mounting frame 104. By reducing the size of the mounting frame 104, and not entirely circumferentially surrounding the connector module 102 (for example, by having the U-shaped, open end), the overall footprint of the connector assembly 100 is smaller. The weight of the connector assembly 100 may be less by removing the second end of the mounting frame 104 and having the second end open. The contacts 132 are configured to be positioned closer to the edge of the footprint by eliminating a second end wall of the mounting frame 104, which allows greater spacing, or pitch, between the contacts 132 and/or allows a greater number of contacts 132 within the footprint.

Figure 2:
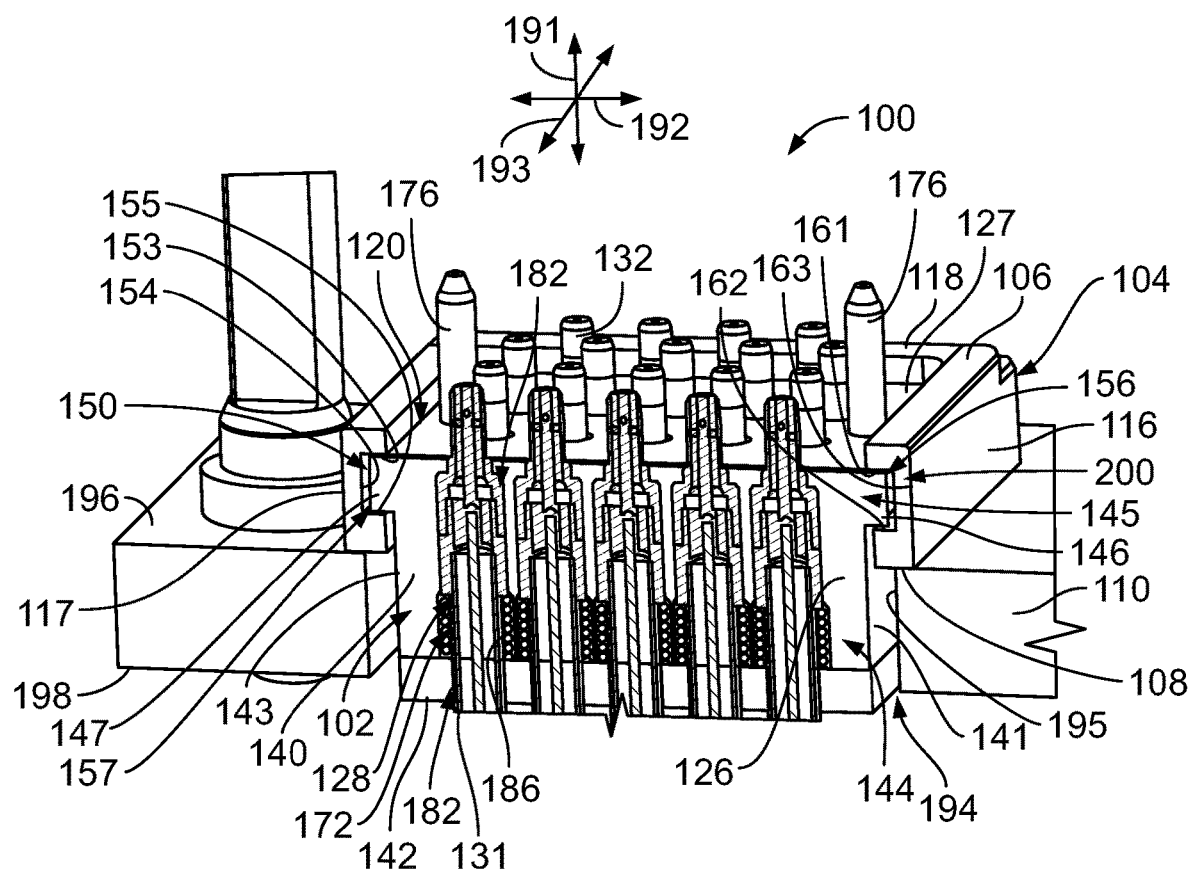
FIG. 2 is a cross-sectional view of the connector assembly in accordance with an exemplary embodiment.

FIG. 2 is a cross-sectional view of the connector assembly 100 in accordance with an exemplary embodiment. FIG. 2 shows the connector module 102 coupled to the mounting frame 104 and shows the mounting frame 104 coupled to the support wall 110. The support wall 110 includes a support wall opening 194 defined by support wall edges 195. The support wall opening 194 extends entirely through the support wall 110 between a first surface 196 or front of the support wall 110 and a second surface 198 or rear of the support wall 110. The mounting frame 104 is configured to be mounted to the first surface 196 and is located forward of the first surface 196. The connector module 102 is received in the support wall opening 194. The connector assembly 100 passes through the support wall opening 194 in the support wall 110. In an exemplary embodiment, a portion of the connector module 102 is located forward of the first surface 196 and a portion of the connector module 102 may be located rearward of the first surface 196. Optionally, a portion of the connector module 102 may be located rearward of the second surface 198.

The connector body 126 includes a forward section 140 and a rear section 142. In an exemplary embodiment, the forward and rear sections 140, 142 are discrete elements that are configured to be secured to each other, such as using hardware (e.g., screws), but may be secured to each other in other manners in alternative embodiments. The forward section 140 includes a main portion 144 and a flange portion 145 that extends laterally (or radially) away from the main portion 144. In an exemplary embodiment, the flange portion 145 includes a side flange defined by a first lip 146 and a side flange defined by a second lip 147 at opposite first and second sides 141, 143 of the connector body 126. The flange portion 145 may include other flange sections, such as an end flange (not shown) at a first end 149 of the connector body 126. In an exemplary embodiment, the flange portion 145 is provided at the front side 127 of the connector body 126. The lips 146, 147 include forward facing surfaces, rearward-facing surfaces, and outward facing surfaces. The forward facing surfaces and/or the rearward-facing surfaces and/or the outward facing surfaces may be used for locating the connector module 102 within the mounting frame 104. For example, the forward facing surfaces and rearward-facing surfaces may be used for locating the connector module 102 in the mating direction along the mating axis 191 and the outward facing surfaces may be used for locating the connector module 102 in one or more lateral directions, such as along the first lateral axis 192 and/or the third lateral axis 193.

The mounting frame 104 includes one or more channels 150 that receive the lips 146, 147. For example, the mounting frame 104 includes a first side wall channel 156 along the first side wall 116 and a second side wall channel 157 along the second side wall 117. The mounting frame may include a first end wall channel (not shown) along the first end wall 118. The channels 156, 157 are open to the passage 120. The channels 156, 157 are sized and shaped to receive the lips 146, 147. In an exemplary embodiment, the channels 150 each include a front rim 153 at the mating side 106 and a rear rim 155 at the mounting side 108. The channels 150 each include an outer wall 154 between the front rim 153 and the rear rim 155. The front rim 153, the rear rim 155, and the outer wall 154 define portions of the connector module support structures 200.

The connector module support structure 200 includes blocking surfaces 160 used to block or retain the connector module 102 in the mounting frame 104. In an exemplary embodiment, the front rim 153, the rear rim 155, and the outer wall 154 define blocking surfaces 160. The blocking surfaces 160 may limit or restrict movement of the connector module 102 in an axial direction along the mating axis 191 (for example, the front rim 153 and the rear rim 155 may restrict movement along the mating axis 191). The blocking surfaces 160 may limit or restrict movement of the connector module 102 in a lateral direction along the lateral axis 192 and/or the lateral axis 193 (for example, the outer wall 154 may restrict movement along the lateral axis 192 or the lateral axis 193). The mounting frame 104 may include additional blocking surfaces 160 in alternative embodiments. Other structures may form connector module support structures 200 that cooperate with the blocking surfaces 160 to confine movement of the connector module 102 within the mounting frame 104.

In an exemplary embodiment, the blocking surfaces 160 include front blocking surfaces 161, rear blocking surfaces 162 and end blocking surfaces 163. The front blocking surfaces 161 limit or restrict movement in the mating direction. The rear blocking surfaces 162 limit or restrict movement in the mounting direction. The end blocking surfaces 163 limit or restrict movement in one or more lateral directions. In an exemplary embodiment, the front rims 153 define the front blocking surfaces 161, the rear rims 155 defines the rear blocking surface 162 and the outer walls 154 define the end blocking surfaces 163. The end blocking surfaces 163 face in the lateral direction that is perpendicular to the mating axis 191 to limit or restrict movement in the lateral direction. In an exemplary embodiment, the passage 120 and the channels 150 are oversized relative to the connector module 102 to allow a limited amount of floating movement of the connector module 102 within the mounting frame 104, such as in the lateral direction. For example, the end blocking surfaces 163 may be wider than the connector body 126 at the flange portion 145 to allow shifting in at least one of the lateral directions 192, 193. Gaps may be provided between the lips 146, 147 and the outer walls 154 to allow the confined and limited amount of floating movement. In various embodiments, the end blocking surfaces 163 may permit the connector module 102 to float at least 0.15 mm along a lateral plane. In various embodiments, the connector module 102 may be permitted to float at least 0.25 mm or, more particularly, at least 0.35 mm along the lateral plane. It should be understood, however, that the connector assembly 100 may be configured to permit a greater or lesser amount of floating than the values provided above. The amount of floating movement may be controlled based on manufacturing tolerances of the connector assemblies 100, 300.

The lips 146, 147 of the flange portion 145 are configured to be retained or trapped between the front and rear rims 153, 155 of the mounting frame 104. The blocking surfaces 160 may limit axial movement along the mating axis 191. Optionally, the connector module 102 may have a limited amount of floating movement in the mating axial direction between the front and rear rims 153, 155. Alternatively, the lips 146, 147 may have a tight fit between the front and rear rims 153, 155 such that there is no movement in the mating axial direction.

The forward section 140 includes a plurality of contact cavities 172, and the rear section 142 includes a plurality of contact cavities 182. When the forward and rear sections 140, 142 are coupled to each other, the contact cavities 172 of the forward section 140 and the contact cavities 182 of the rear section 142 align with each other to form contact channels 184. Each of the contact channels 184 is configured to receive a portion of a corresponding cable assembly 128 and, in particular, a corresponding contact 132. Optionally, the contact cavities 182 may open to an outer edge to define open-sided slots sized and shaped to receive the cables 131 of the cable assemblies 128. In an exemplary embodiment, the rear section 142 is used to support the springs 186 of the cable assemblies 128. The contacts 132 may be compressed rearward against the springs 186 during mating with the mating connector module 302 (shown in FIG. 1).

In an exemplary embodiment, the connector module 102 includes alignment posts 176 that extend forward from the of the front side 127 of the connector body 126 in the mating direction. The alignment posts 176 are configured to engage the connector module 302 (FIG. 1) during the mating operation. In the illustrated embodiment, the connector assembly 100 includes two alignment posts 176. In other embodiments, however, the connector assembly 100 may include only one alignment post 176 or more than two alignment posts 176.

Figure 3:
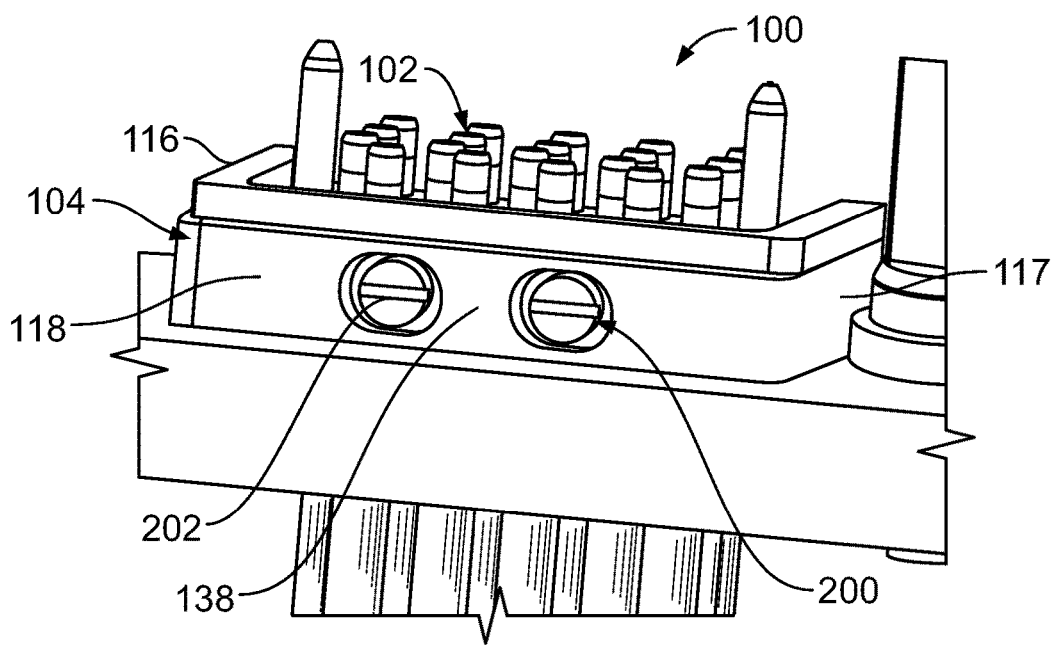
FIG. 3 is a side perspective view of the connector assembly in accordance with an exemplary embodiment.

FIG. 3 is a side perspective view of the connector assembly 100 in accordance with an exemplary embodiment. In an exemplary embodiment, the connector module support structure 200 includes support pins 202 used to support the connector module 102 relative to the mounting frame 104. In the illustrated embodiment, the support pins 202 are coupled to the first end wall 118, such as to the frame extension 138. However, the support pins 202 may be coupled to other portions of the mounting frame 104, such as the first side wall 116 and/or the second side wall 117. Optionally, the support pins 202 may be threaded support pins threadably coupled to the connector module 102 and/or the mounting frame 104.

Figure 4:
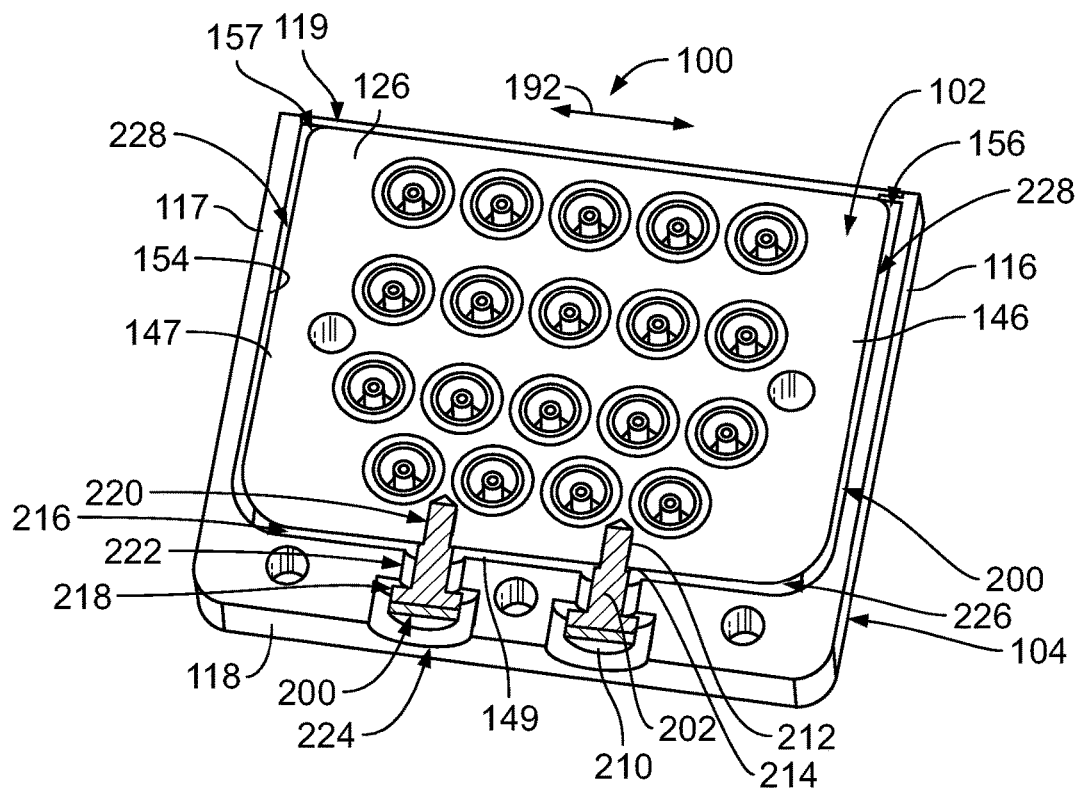
FIG. 4 is a cross-sectional view of the connector assembly in accordance with an exemplary embodiment.
Figure 5:
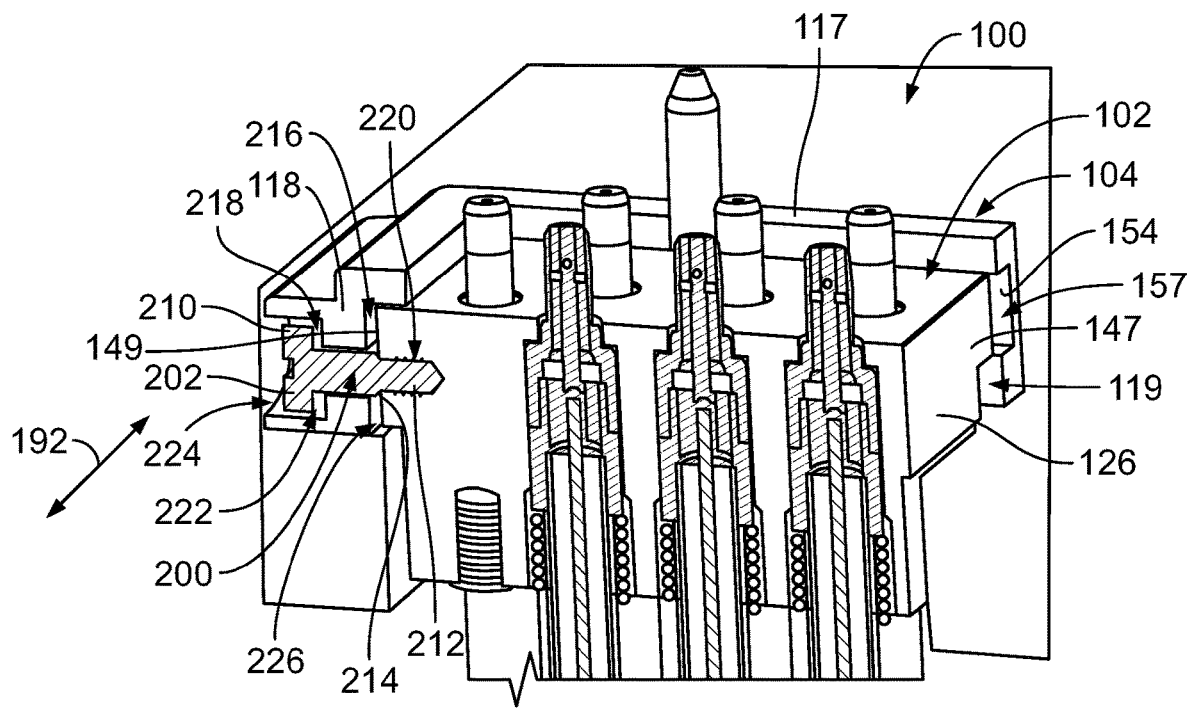
FIG. 5 is a cross-sectional view of the connector assembly in accordance with an exemplary embodiment.

FIG. 4 is a cross-sectional view of the connector assembly 100 in accordance with an exemplary embodiment taken through the support pins 202. FIG. 5 is a cross-sectional view of the connector assembly 100 in accordance with an exemplary embodiment taken through the support pins 202. Each support pin 202 is coupled to the mounting frame 104 and coupled to the connector module 102. The support pins 202 confine movement of the connector module 102 relative to the mounting frame 104. In an exemplary embodiment, the support pins 202 allow a limited amount of floating movement of the connector module 102 relative to the mounting frame 104.

In an exemplary embodiment, the support pin 202 includes a head 210 and a base 212 opposite the head 210. The base 212 may be threaded such that the support pin 202 may be threadably coupled to the connector body 126 of the connector module 102. In an exemplary embodiment, the support pin 202 is a shoulder screw having a shoulder 214 between the head 210 and the base 212. The shoulder 214 is configured to bottom out against the connector body 126. The support pin 202 has a length between the head 210 and the shoulder 214 that is longer than a thickness of the first end wall 118 leading to a gap 216 between the first end 149 of the connector body 126 and the first end wall 118; and/or a gap 218 between the head 210 and the first end wall 118.

The connector body 126 includes a first slot 220 that receives the base 212 of the support pin 202. For example, the first slot 220 is provided at the first end 149 of the connector body 126. The first slot 220 may be threaded to threadably receive the base 212 of the support pin 202. The mounting frame 104 includes a second slot 222 that receives the shaft of the support pin 202. For example, the second slot 222 is provided at the first end wall 118 of the mounting frame 104. In various embodiments, the mounting frame 104 includes a pocket 224 open to the second slot 222. The pocket 224 receives the head 210 of the support pin 202. In an exemplary embodiment, the second slot 222 is elongated (for example, side-to-side) to allow the support pin 202 to move within the second slot 222. For example, the second slot 222 may be elongated in a lateral direction, such as along the lateral axis 192. The pocket 224 may be elongated to allow the head 210 to move laterally within the pocket 224. The amount of oversizing of the second slot 222 and/or the pocket 224 may define the amount of floating travel of the support pin 202 and the connector module 102 relative to the mounting frame 104. For example, the first end wall 118 defines blocking surfaces that restrict or define the amount of floating movement of the connector module 102 relative to the mounting frame 104.

Gaps 226 are provided between the support pin 202 and the mounting frame 104 to define the amount of floating movement. Gaps 228 are provided between the side lips 146, 147 and the side walls 116, 117, such as between the side lips 146, 147 and the outer walls 154 of the channels 156, 157. The gaps 226, 228 allow relative movement of the connector module 102 and the mounting frame 104. In an exemplary embodiment, the support pin 202 is used to block or restrict movement in a first direction (for example, through the window 119) and the end wall 118 is used to block or restrict movement in a second direction opposite the first direction. The side walls 116, 117 block or restrict movement in third and fourth directions perpendicular to the first and second directions. As such, the mounting frame 104 confines movement in three directions and the support pin 202 confines movement in the fourth direction.

Figure 6:
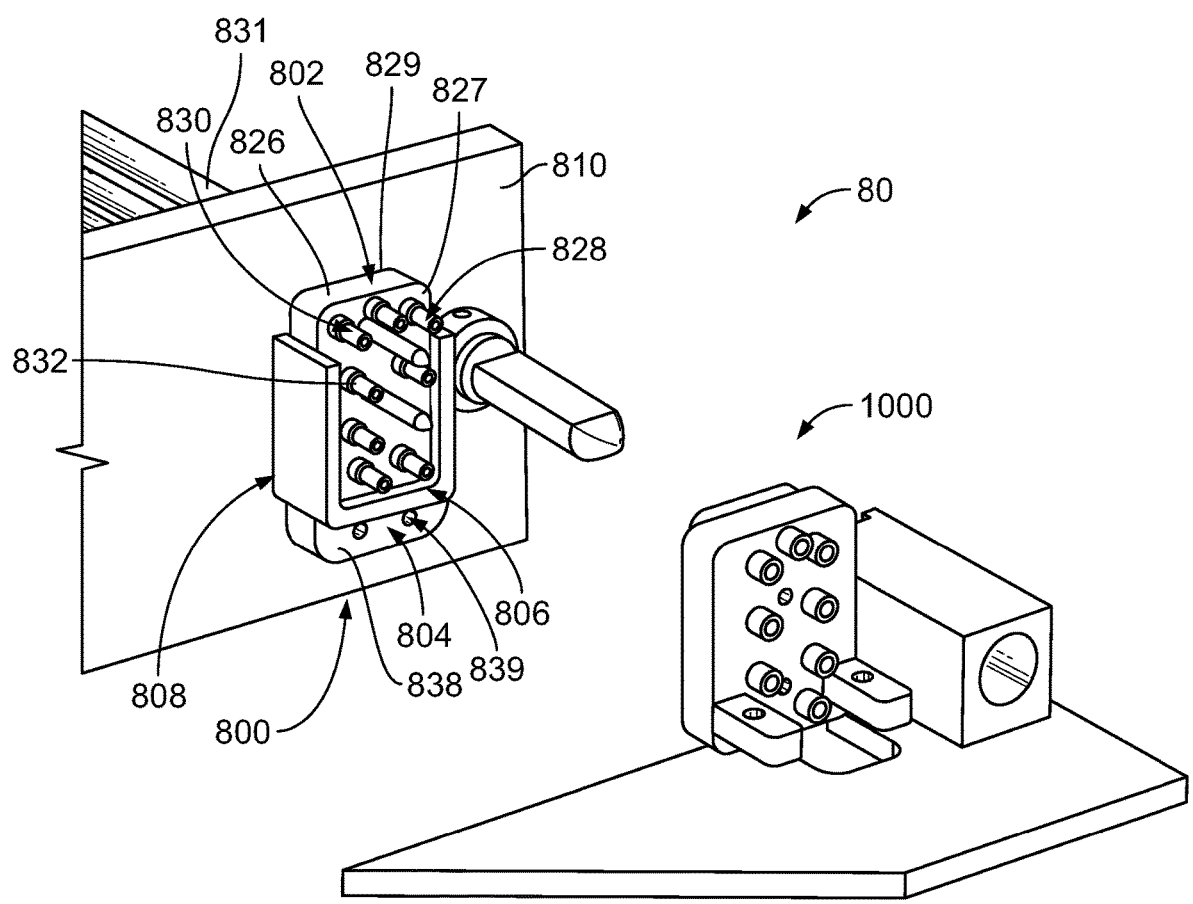
FIG. 6 is a perspective view of a communication system formed in accordance with an exemplary embodiment with a connector assembly.

FIG. 6 is a perspective view of a communication system 80 formed in accordance with an exemplary embodiment, showing a connector assembly 800 and a connector assembly 700 in an unmated state. The connector assemblies 800, 700 are configured to be mated along a mating axis. The connector assemblies 800, 700 may be coaxial connector assemblies. The connector assembly 800 is similar to the connector assembly 100 shown in FIG. 1 and the connector assembly 700 is similar to the connector assembly 300 shown in FIG. 1.

The connector assembly 800 includes a connector module 802 and a mounting frame 804 that are operably coupled to each other. The connector module 802 is mounted to a support wall 810. The support wall 810 may be, for example, a circuit board (for example, a backplane circuit board), a panel, or another type of wall. The mounting frame 804 is used to secure the connector module 802 to the support wall 810. The connector module 802 is configured to pass through a support wall opening in the support wall 810. In an exemplary embodiment, the mounting frame 804 is slightly oversized relative to the connector module 802 such that the connector module 802 has a limited amount of floating movement relative to the mounting frame 804, such as for alignment with the connector assembly 700 during mating. For example, the connector module 802 is permitted to move in a lateral direction during a mating operation (for example, parallel to the plane of the support wall 810). In an exemplary embodiment, the support wall 810 cooperates with the mounting frame 804 to confine and limit the amount of floating movement relative to the mounting frame 804. For example, the support wall 810 blocks movement in one direction and the mounting frame 804 blocks movement in three directions. The support wall 810 is used for confining movement in one direction in lieu of using a support pin, such as the support pin 202 (shown in FIGS. 4 and 5).

The mounting frame 804 includes opposite mating and mounting sides 806, 808. The mounting frame 804 includes a passage 820 that extends through the mating and mounting sides 806, 808. The passage 820 is sized and shaped to receive a portion of the connector module 802. The mounting frame 804 may include a frame extension 838 configured to interface with the support wall 810. The frame extension 838 includes one or more through holes 839 that are sized and shaped to receive hardware (e.g., screws, bolts, plugs, and the like) for securing the mounting frame 804 to the support wall 810.

The connector module 802 includes a connector body 826 having a front side 827 and a rear side 829 that face in the mating direction and the mounting direction, respectively. The connector module 802 also includes a contact array 830 of contacts 832 that are coupled to the connector body 826. The connector body 826 holds the contacts 832 at designated positions for engaging corresponding contacts (not shown) of the connector assembly 700. In the illustrated embodiment, the contacts 832 are elements of corresponding cable assemblies 828 terminated to ends of cables 831.

Figure 7:
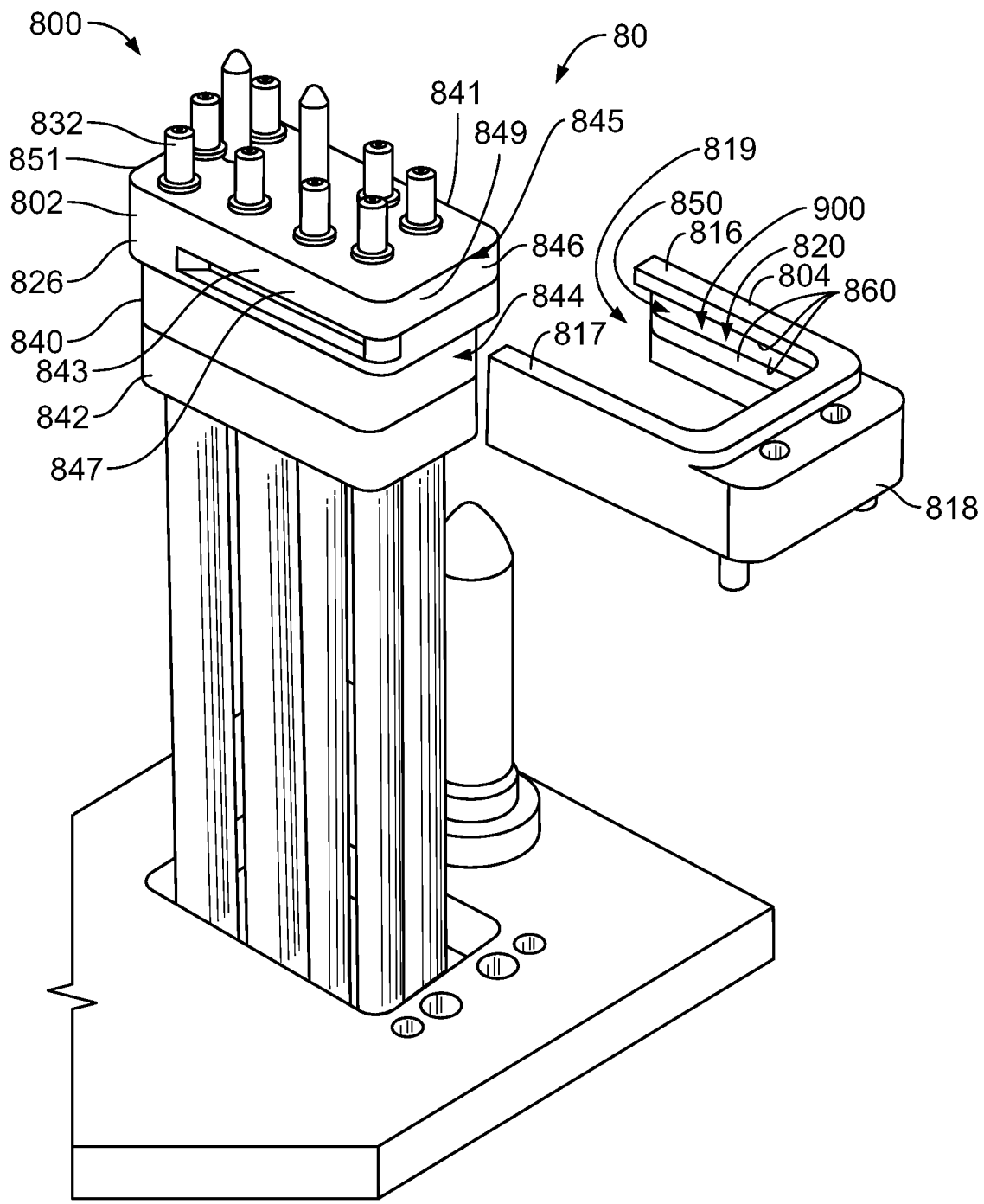
FIG. 7 is an exploded view of a portion of the connector assembly in accordance with an exemplary embodiment.

FIG. 7 is an exploded view of a portion of the connector assembly 800. The connector body 826 includes a forward section 840 and a rear section 842. The forward and rear sections 840, 842 are discrete elements that are configured to be secured to each other. The forward section 840 includes a main portion 844 and a flange portion 845 that extends laterally (or radially) away from the main portion 844. The flange portion 845 may be defined by a first lip 846 and a second lip 847 at opposite first and second sides 841, 843. The flange portion 845 may include other lips in alternative embodiments, such as a lip along the end.

The mounting frame 804 includes a window 819 along the second end that is open to the passage 820. The mounting frame 804 is U-shaped with first and second side walls 816, 817 and a first end wall 818. Optionally, the connector module 102 may be longer (for example, taller) than the mounting frame 804 such that the connector module 802 extends beyond the window 819. Optionally, at least one of the contacts 832 are located outside of the passage 820, such as beyond the window 819. The connector module 802 is movable into and out of the passage 820 through the window 819.

The side walls 816, 817 include channels 850 open to the passage 820 that receive the lips 846, 847 of the flange portion 845. The lips 846, 847 are provided at first and second sides 841, 843 of the connector body 826. The connector body 826 includes a first end 849 and a second end 851 opposite the first end 849.

The mounting frame 804 includes a connector module support structure 900 used to support the connector module 802 relative to the mounting frame 804. In an exemplary embodiment, the connector module support structure 900 includes blocking surfaces 860 used to block or retain the connector module 802 in the mounting frame 804. The blocking surfaces 860 may limit or restrict movement of the connector module 802 in an axial direction along the mating axis. The blocking surfaces 860 may limit or restrict movement of the connector module 802 in a lateral direction. In an exemplary embodiment, the blocking surfaces 860 are defined by the end wall 818 and the side walls 816, 817, such as the channels 850. The mounting frame 804 may include additional blocking surfaces 860 in alternative embodiments.

Figure 8:
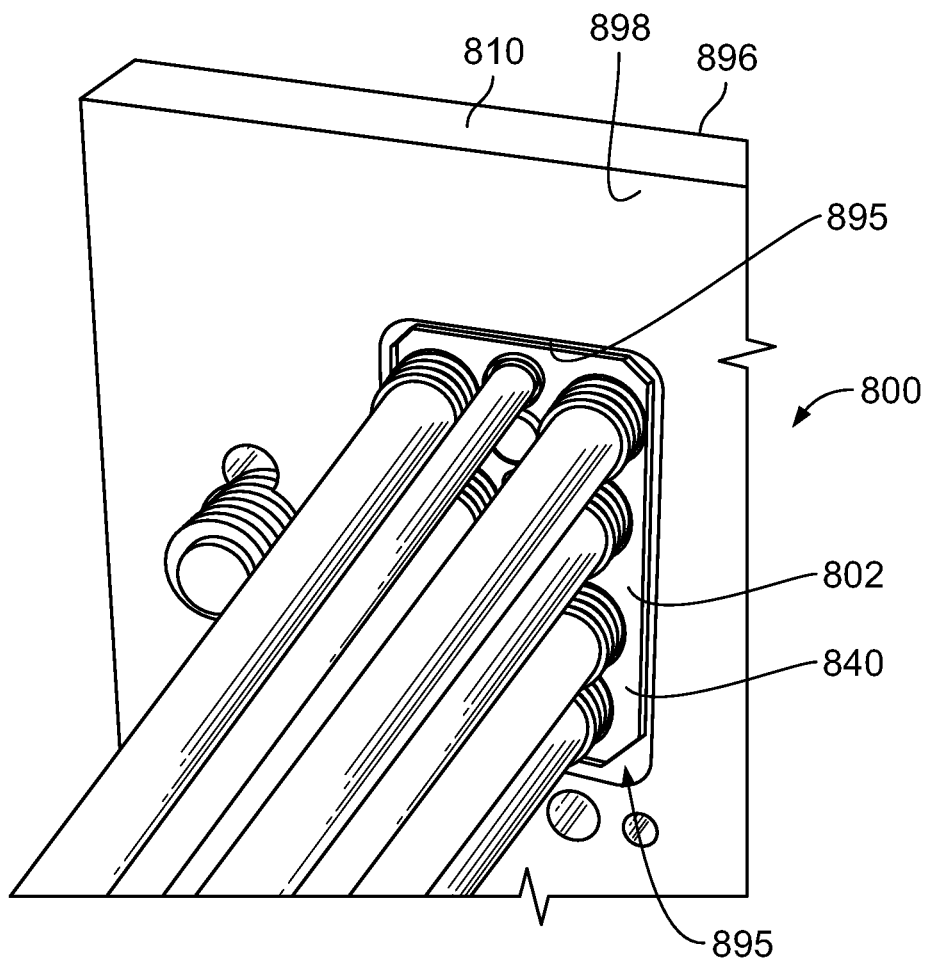
FIG. 8 is a rear perspective view of a portion of the connector assembly in accordance with an exemplary embodiment.

FIG. 8 is a rear perspective view of a portion of the connector assembly 800 showing the connector module 802 extending through the support wall 810. The connector module 102 is shown with the front section 840, with the rear section (shown in FIG. 7) removed for clarity.

In an exemplary embodiment, the support wall 810 defines a blocking surface cooperating with the blocking surfaces 860 (shown in FIG. 7) to confine the connector module 802 relative to the support wall 810 and the mounting frame 804 (shown in FIG. 7). The support wall 810 includes a support wall opening 894 defined by support wall edges 895. In an exemplary embodiment, at least one support wall edge 895 defines a blocking surface for confining movement of the connector module 802. The support wall opening 894 extends entirely through the support wall 810 between a first surface 896 or front of the support wall 810 and a second surface 898 or rear of the support wall 810. The mounting frame 804 is configured to be mounted to the first surface 896 and is located forward of the first surface 896. The connector module 802 is received in the support wall opening 894. The connector assembly 800 passes through the support wall opening 894 in the support wall 810.

Figure 9:
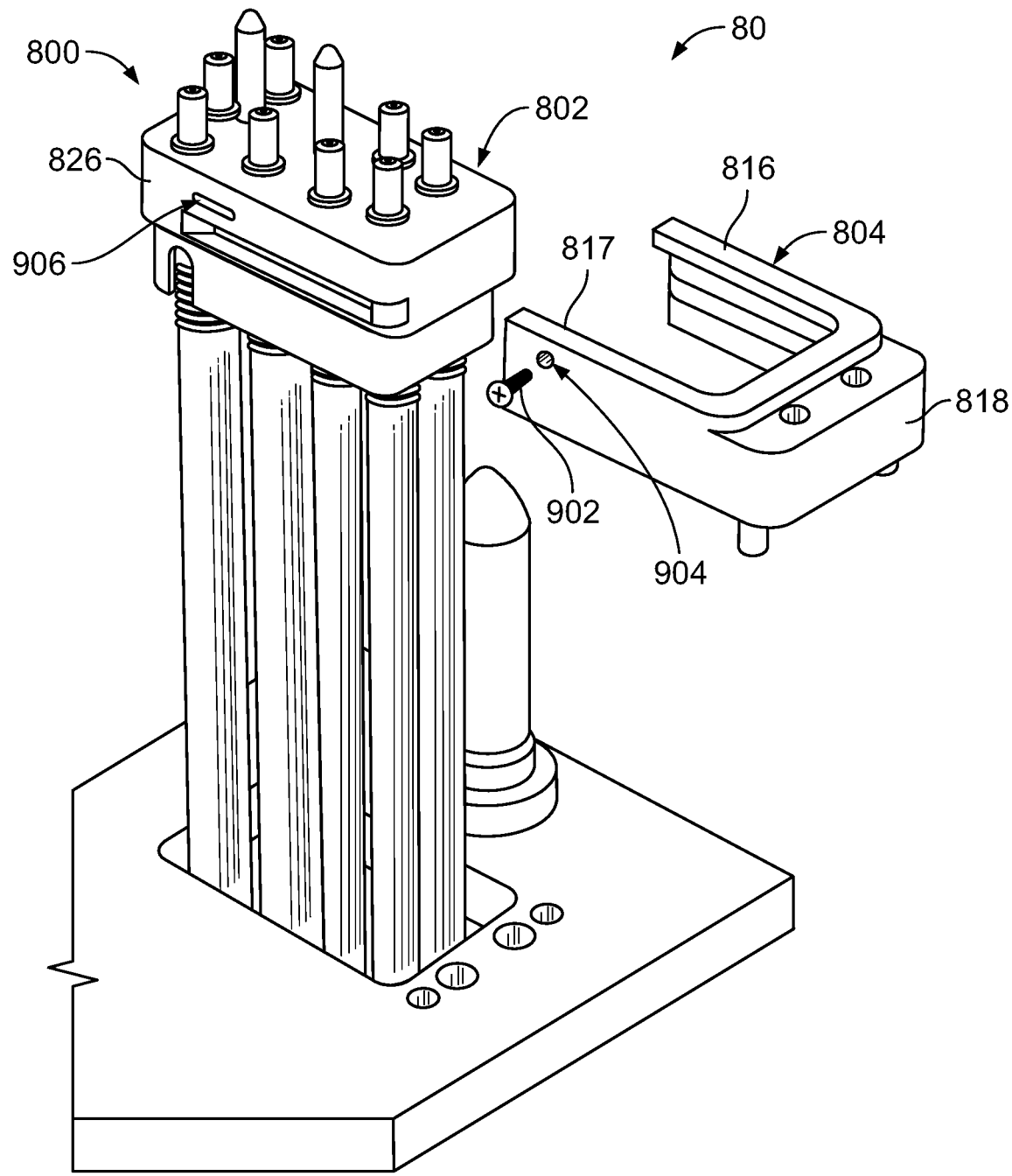
FIG. 9 is a perspective view of the communication system formed in accordance with an exemplary embodiment showing the connector assembly.

FIG. 9 is a perspective view of the communication system 80 formed in accordance with an exemplary embodiment, showing the connector assembly 800. The connector assembly 800 includes the connector module 802 and the mounting frame 804. In an exemplary embodiment, the connector assembly 800 includes a support pin 902 used to support the connector module 802 relative to the mounting frame 804.

The support pin 902 is received in a slot 904 in the side wall 816 or the side wall 817 of the mounting frame 804, as compared to the end wall 818. The connector body 826 of the connector module 802 includes a slot 906 that receives the support pin 902. The slot 906 is elongated relative to the support pin 902 allowing the connector module 802 to move in a lateral direction relative to the support pin 902. The amount of oversize of the slot 906 defines the limited amount of floating movement of the connector module 802 relative to the mounting frame 804 in the lateral direction. Optionally, support pins 902 may be provided on both sides.

Figure 10:
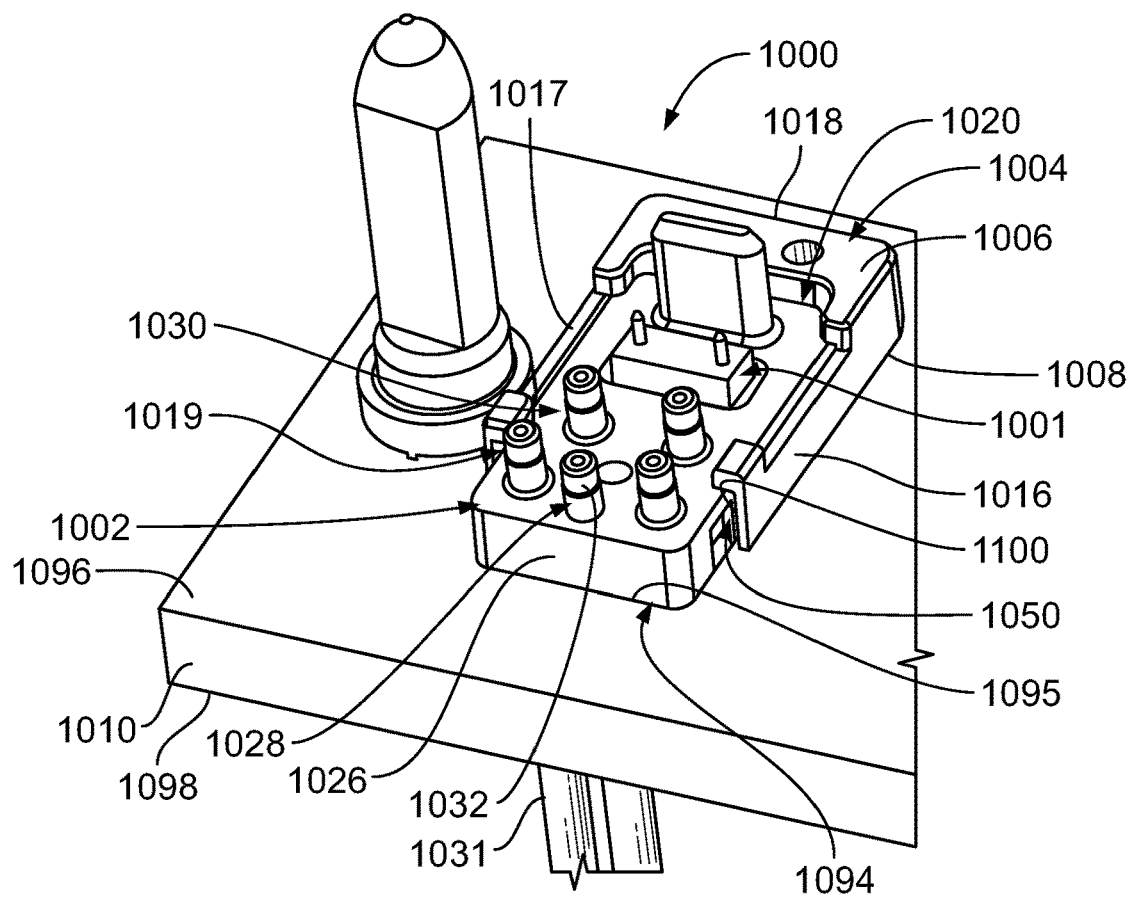
FIG. 10 is a perspective view of a connector assembly formed in accordance with an exemplary embodiment.
Figure 11:
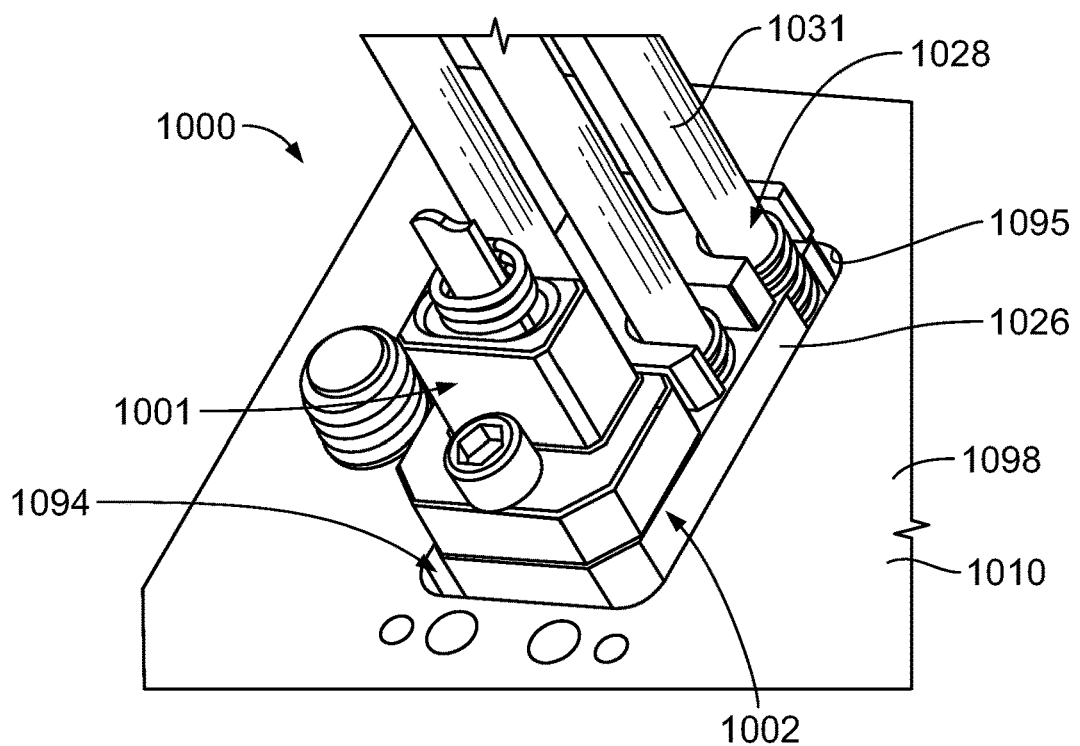
FIG. 11 is a perspective view of the connector assembly shown in FIG. 10 formed in accordance with an exemplary embodiment.

FIG. 10 is a perspective view of a connector assembly 1000 formed in accordance with an exemplary embodiment configured to be mated to a mating connector assembly (not shown). FIG. 11 is a perspective view of the connector assembly 1000 formed in accordance with an exemplary embodiment. The connector assembly 1000 is similar to the connector assembly 100 shown in FIG. 1; however, the connector assembly 1000 includes a different arrangement of cable assemblies and includes a fiber optic component 1001. The fiber optic component 1001 includes fiber optic contacts, such as fiber optic ferrules.

The connector assembly 1000 includes a connector module 1002 and a mounting frame 1004 that are operably coupled to each other. The connector module 1002 is mounted to a support wall 1010. The support wall 1010 may be, for example, a circuit board (for example, a backplane circuit board), a panel, or another type of wall. The mounting frame 1004 is used to secure the connector module 1002 to the support wall 1010. The connector module 1002 is configured to pass through a support wall opening in the support wall 1010. The support wall 1010 is used to contain and position the connector module 1002 within the support wall opening. In an exemplary embodiment, the mounting frame 1004 is slightly oversized relative to the connector module 1002 such that the connector module 1002 has a limited amount of floating movement relative to the mounting frame 1004, such as for alignment with the mating connector assembly during mating. For example, the connector module 1002 is permitted to move in a lateral direction during a mating operation (for example, parallel to the plane of the support wall 1010). In an exemplary embodiment, the support wall 1010 cooperates with the mounting frame 1004 to confine and limit the amount of floating movement relative to the mounting frame 1004. For example, the support wall 1010 blocks movement in one direction and the mounting frame 1004 blocks movement in three directions. The support wall 1010 is used for confining movement in one direction in lieu of using a support pin, such as the support pin 202 (shown in FIGS. 4 and 5). However, in alternative embodiments, support pins may be used to confine floating movement of the connector module 1002 relative to the mounting frame 1004.

The connector module 1002 includes a connector body 1026 holding a contact array 1030 of contacts 1032 of cable assemblies 1028 terminated to ends of cables 1031.

The mounting frame 1004 includes opposite mating and mounting sides 1006, 1008. The mounting frame 1004 includes a passage 1020 that extends through the mating and mounting sides 1006, 1008. The passage 1020 is sized and shaped to receive a portion of the connector module 1002.

The mounting frame 1004 includes a window 1019 open to the passage 1020. The mounting frame 1004 is U-shaped with first and second side walls 1016, 1017 and a first end wall 1018. The side walls 1016, 1017 include channels 1050 open to the passage 1020 that receive the connector body 1026. Optionally, the connector module 102 may be longer than the mounting frame 1004 such that the connector module 1002 extends beyond the window 1019. Optionally, at least one of the contacts 1032 are located outside of the passage 1020, such as beyond the window 1019. The connector module 1002 is movable into and out of the passage 1020 through the window 1019.

The mounting frame 1004 includes a connector module support structure 1100 used to support the connector module 1002 relative to the mounting frame 1004. In an exemplary embodiment, the connector module support structure 1100 includes blocking surfaces used to block or retain the connector module 1002 in the mounting frame 1004. The blocking surfaces may limit or restrict movement of the connector module 1002 in an axial direction along the mating axis. The blocking surfaces may limit or restrict movement of the connector module 1002 in a lateral direction. In an exemplary embodiment, the blocking surfaces are defined by the end wall 1018 and the side walls 1016, 1017, such as the channels 1050. The mounting frame 1004 may include additional blocking surfaces in alternative embodiments.

In an exemplary embodiment, the support wall 1010 defines a blocking surface cooperating with the blocking surfaces of the mounting frame 1004 to confine the connector module 1002 relative to the support wall 1010 and the mounting frame 1004. The support wall 1010 includes a support wall opening 1094 defined by support wall edges 1095. In an exemplary embodiment at least one support wall edge 1095 defines a blocking surface for confining movement of the connector module 1002. The support wall opening 1094 extends entirely through the support wall 1010 between a first surface 1096 or front of the support wall 1010 and a second surface 1098 or rear of the support wall 1010. The mounting frame 1004 is configured to be mounted to the first surface 1096 and is located forward of the first surface 1096. The connector module 1002 is received in the support wall opening 1094. The connector assembly 1000 passes through the support wall opening 1094 in the support wall 1010. The support wall edge 1095 blocks movement of the connector module 1002 relative to the mounting frame 1004, such as in one or more lateral directions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A connector assembly comprising:
a connector module having a connector body extending between a front side and a rear side, the connector body having edges between the front side and the rear side, the edges including a first side edge, a second side edge opposite the first side edge, a first end edge and a second end edge opposite the first end edge, the connector body having contact channels therethrough between the front side and the rear side, the contact channels holding contacts in corresponding contact channels, the contacts being presented along the front side for engaging corresponding mating contacts of a mating connector, the front side facing in a mating direction along a mating axis;
a mounting frame having a passage extending between a mating side and a mounting side of the mounting frame that face in opposite directions, the mounting frame having a first side wall, a second side wall opposite the first side wall, and an end wall between the first side wall and the second side wall, the mounting frame having a window between the first side wall and the second side wall opposite the end wall, the window being open to and providing access to the passage, the passage receiving the connector body of the connector module through the window in a direction generally perpendicular to the mating axis, the mounting side facing in a mounting direction and configured to interface with a support wall, the mounting frame including a connector module support structure for supporting the connector module in the passage of the mounting frame, the connector module support structure including a support pin coupled between the mounting frame and the connector body, the connector module support structure defines a confined space oversized relative to the connector body of the connector module to allow a limited amount of floating movement in the confined space in a lateral direction that is perpendicular to the mating direction, the support pin being movable relative to at least one of the mounting frame and the connector body in the lateral direction.

2. The connector assembly of claim 1, wherein the mounting frame is U-shaped.

3. The connector assembly of claim 1, wherein the second end edge of the connector body is flush with or located outside of the window.

4. The connector assembly of claim 1, wherein at least one of the contacts is located outside of the passage beyond the window.

5. The connector assembly of claim 1, wherein the connector module is side loaded into the passage through the window to interface with the connector module support structure.

6. The connector assembly of claim 1, wherein the connector module support structure includes a first channel in the first side wall, a second channel in the second side wall and a third channel in the first end wall, the connector body of the connector module including a flange including a first lip received in the first channel, a second lip received in the second channel, and a third lip received in the third channel.

7. The connector assembly of claim 1, wherein the connector module support structure includes a first side blocking surface defined by the first side wall, a second side blocking surface defined by the second side wall, and a first end blocking surface defined by the first end wall, the first side blocking surface cooperating with the second side blocking surface to confine movement of the connector module to a limited amount of floating movement within the passage.

8. The connector assembly of claim 7, wherein the support wall includes an opening defined by support wall edges, at least one of the support wall edges defining a support wall blocking surface opposite the first end blocking surface configured to cooperate with the first end blocking surface to confine movement of the connector module to a limited amount of floating movement within the passage.

9. The connector assembly of claim 7, wherein the connector module support structure includes the support pin configured to engage the mounting frame and configured to engage the connector body of the connector module, the support pin configured to cooperate with the first end blocking surface to confine movement of the connector module to a limited amount of floating movement within the passage.

10. The connector assembly of claim 9, wherein the support pin passes through the first end wall to engage the connector body of the connector module.

11. The connector assembly of claim 9, wherein the support pin passes through the first side wall to engage the connector body of the connector module.

12. The connector assembly of claim 1, wherein the connector module support structure includes the support pin having a head and a base, the head being secured to the mounting frame, the base extending into the connector body of the connector module to interface with the connector body.

13. The connector assembly of claim 1, wherein the mounting frame includes a first slot, the connector body of the connector module includes a second slot, the connector module support structure includes the support pin extending through the first slot of the mounting frame into the second slot of the connector body, at least one of the first slot and the second slot being oversized relative to the support pin to allow a limited amount of floating movement of the support pin relative to at least one of the mounting frame and the connector body.

14. The connector assembly of claim 1, wherein the connector body is movable in a first lateral direction relative to the mounting frame perpendicular to the mating axis and the connector body is movable in a second lateral direction relative to the mounting frame perpendicular to the first lateral direction and perpendicular to the mating direction.

15. A connector assembly configured to be mounted to a support wall at an opening in the support wall defined by support wall edges extending between a first surface and a second surface of the support wall, the connector assembly comprising:

a connector module having a connector body extending between a front side and a rear side, the connector body having edges between the front side and the rear side, the edges including a first side edge, a second side edge opposite the first side edge, a first end edge and a second end edge opposite the first end edge, the edges of the connector body configured to pass through the opening in the support wall such that the front side is forward of the first surface of the support wall and the rear side is rearward of the first surface of the support wall, the connector body having contact channels therethrough between the front side and the rear side, the contact channels holding contacts in corresponding contact channels, the contacts being presented along the front side for engaging corresponding mating contacts of a mating connector, the front side facing in a mating direction along a mating axis, the contacts being spring biased within the contact channels for mating with the mating contacts, the contacts having cables terminated thereto extending rearward from the connector module;

a mounting frame having a passage extending between a mating side and a mounting side of the mounting frame that face in opposite directions, the mounting frame having a first side wall, a second side wall opposite the first side wall, and an end wall between the first side wall and the second side wall, the mounting frame having a window between the first side wall and the second side wall opposite the end wall, the window being open to and providing access to the passage, the passage receiving the connector body of the connector module through the window in a direction generally perpendicular to the mating axis, the mounting side facing in a mounting direction and configured to interface with the first surface of the support wall, the mounting frame including a connector module support structure for supporting the connector module in the passage of the mounting frame, the connector module support structure defines a confined space oversized relative to the connector body of the connector module to allow a limited amount of floating movement in the confined space, the connector module support structure includes a first side blocking surface defined by the first side wall, a second side blocking surface defined by the second side wall, and a first end blocking surface defined by the first end wall, the first side blocking surface cooperating with the second side blocking surface to confine movement of the connector module in a first lateral direction to a limited amount of floating movement in the first lateral direction within the passage, the first end blocking surface cooperating with the support wall edge of the support wall to confine movement of the connector module in a second lateral direction to a limited amount of floating movement in the second lateral direction within the passage, the connector module support structure including a support pin coupled between the mounting frame and the connector body, the support pin being movable relative to at least one of the mounting frame and the connector body in the lateral direction.

16. The connector assembly of claim 15, wherein the connector body is undersized relative to the support wall opening to allow the connector body to move relative to the support wall within the support wall opening.

17. The connector assembly of claim 15, wherein the connector module support structure includes a first channel in the first side wall defining the first side blocking surface, a second channel in the second side wall defining the second side blocking surface and a third channel in the first end wall defining the first end blocking surface, the connector body of the connector module including a flange including a first lip received in the first channel, a second lip received in the second channel, and a third lip received in the third channel.

18. A connector assembly configured to be mounted to a support wall, the connector assembly comprising:

a connector module having a connector body extending between a front side and a rear side, the connector body having edges between the front side and the rear side, the edges including a first side edge, a second side edge opposite the first side edge, a first end edge and a second end edge opposite the first end edge, the connector body having contact channels therethrough between the front side and the rear side, the contact channels holding contacts in corresponding contact channels, the contacts being presented along the front side for engaging corresponding mating contacts of a mating connector, the front side facing in a mating direction along a mating axis, the contacts being spring biased within the contact channels for mating with the mating contacts, the contacts having cables terminated thereto extending rearward from the connector module;

a mounting frame having a passage extending between a mating side and a mounting side of the mounting frame that face in opposite directions, the mounting frame having a first side wall, a second side wall opposite the first side wall, and an end wall between the first side wall and the second side wall, the mounting frame having a window between the first side wall and the second side wall opposite the end wall, the window being open to and providing access to the passage, the passage receiving the connector body of the connector module through the window in a direction generally perpendicular to the mating axis, the mounting side facing in a mounting direction and configured to interface with the support wall, the mounting frame including a connector module support structure for supporting the connector module in the passage of the mounting frame, the connector module support structure defines a confined space oversized relative to the connector body of the connector module to allow a limited amount of floating movement in the confined space, the connector module support structure includes a first side blocking surface defined by the first side wall, a second side blocking surface defined by the second side wall, and a first end blocking surface defined by the first end wall, the connector module support structure includes a support pin coupled to the mounting frame and coupled to the connector body of the connector module, the first side blocking surface cooperating with the second side blocking surface to confine movement of the connector module in a first lateral direction to a limited amount of floating movement in the first lateral direction within the passage, the first end blocking surface cooperating with the support pin to confine movement of the connector module in a second lateral direction to a limited amount of floating movement in the second lateral direction within the passage.

19. The connector assembly of claim 18, wherein the support pin includes a head and a base, the base being threadably coupled to the connector body of the connector module, the head configured to engage the mounting frame to confine movement of the connector module and the support pin relative to the mounting frame, the mounting frame including a slot receiving the support pin, the slot being oversized relative to the support pin to allow the confined floating movement of the support pin and the connector module relative to the mounting frame.

20. The connector assembly of claim 18, wherein the mounting frame includes a first slot, the connector body of the connector module includes a second slot, the support pin extending through the first slot of the mounting frame into the second slot of the connector body, at least one of the first slot and the second slot being oversized relative to the support pin to allow the confined floating movement of the connector module relative to the mounting frame.

* * * * *